US011502476B2

(12) United States Patent
Honda et al.

(10) Patent No.: US 11,502,476 B2
(45) Date of Patent: Nov. 15, 2022

(54) LASER OSCILLATOR WITH ENHANCED MAINTAINABILITY

(71) Applicant: Fanuc Corporation, Yamanashi (JP)

(72) Inventors: Masahiro Honda, Yamanashi (JP); Yuuta Sugimachi, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 17/078,229

(22) Filed: Oct. 23, 2020

(65) Prior Publication Data
US 2021/0175679 A1 Jun. 10, 2021

(30) Foreign Application Priority Data
Dec. 6, 2019 (JP) .............................. JP2019-221502

(51) Int. Cl.
*H01S 3/067* (2006.01)
*H01S 3/091* (2006.01)
*H01S 3/04* (2006.01)
*H01S 3/0941* (2006.01)

(52) U.S. Cl.
CPC .......... *H01S 3/0912* (2013.01); *H01S 3/0404* (2013.01); *H01S 3/06704* (2013.01); *H01S 3/0941* (2013.01)

(58) Field of Classification Search
CPC ... H01S 3/0912; H01S 3/0404; H01S 3/06704
See application file for complete search history.

(56) References Cited

U.S. PATENT DOCUMENTS

2015/0333467 A1* 11/2015 Tanaka .................. H01S 3/0407
372/6
2018/0056442 A1* 3/2018 Emery .................... H01S 5/042

FOREIGN PATENT DOCUMENTS

| JP | 2012254478 A | 12/2012 |
|---|---|---|
| JP | 2017077586 A | 4/2017 |
| JP | 2017191907 A | 10/2017 |

* cited by examiner

*Primary Examiner* — Michael Carter
(74) *Attorney, Agent, or Firm* — RatnerPrestia

(57) ABSTRACT

A laser oscillator includes a first structure disposed with an optical section, a second structure disposed with a power source section, and an electric cable that electrically connects the optical section and the power source section. The first structure is removably coupled to the second structure, the electric cable is removably connected to at least one of the power source section and the optical section, and the optical section is allowed to be replaced.

9 Claims, 6 Drawing Sheets

LASER OSCILLATOR WITH ENHANCED MAINTAINABILITY

CROSS-REFERENCE TO RELATED APPLICATIONS

This application is a new U.S. Patent Application that claims benefit of Japanese Patent Application No. 2019-221502, filed Dec. 6, 2019, the disclosure of which is incorporated herein by reference in its entirety for all purposes.

BACKGROUND OF THE INVENTION

1. Field of the Invention

The present invention relates to a laser oscillator and more particularly relates to a laser oscillator with enhanced maintainability.

2. Description of the Related Art

The following documents are known as the related art of maintainability of a laser oscillator.

JP 2017-191907 A discloses a clean bench capable of preventing malfunction of optical components due to intrusion of dust and moisture, and excellent performance of maintenance and replacement, check work after the replacement, and the like on an optical unit, and a fiber laser oscillator equipped with the same.

JP 2012-254478 A discloses a deposit removal device that removes a deposit on a surface of a structure by laser light. In particular, it is described that an optical unit including various optical members (e.g., a wedge prism, a focusing lens, a reflective mirror, and the like) can be removed from a laser head.

JP 2017-77586 A discloses a fiber selector and a laser device capable of easily performing maintenance work such as replacement in a short time when constituent components of the fiber selector are damaged.

SUMMARY OF THE INVENTION

Respective optical units in a fiber laser oscillator are coupled by fusing optical fibers to each other. When the optical unit is damaged, the optical fiber can be cut and the damaged unit can be replaced with a new unit, but since a fusing operation of the optical fibers by a dedicated device is necessary, the recovery of the laser oscillator takes time. In particular, since a beam combiner unit is coupled to a plurality of laser cavity units, the operation of fusing the optical fibers for the damaged laser cavity units is required when the beam combiner unit is damaged. Therefore, it takes a large amount of time to replace the beam combiner unit. In addition, since an optical section of the laser oscillator generally has a risk of damage due to dust and moisture, it is difficult to perform maintenance work in a field of a factory or the like, and there is a concern that the damage may occur again after the recovery when the maintenance work is performed at the field. Such a problem is not limited to the fiber laser oscillator, and is applicable to other solid-state laser oscillators, gas laser oscillators, semiconductor lasers, and the like in some cases.

Thus, there is a demand for a technique that enhances maintainability of a laser oscillator.

One aspect of the present disclosure provides a laser oscillator including a first structure disposed with an optical section, a second structure disposed with a power source section, and an electric cable that electrically connects the optical section and the power source section, wherein the first structure is removably coupled to the second structure, the electric cable is removably connected to at least one of the optical section and the power source section, and the optical section is allowed to be replaced.

DETAILED DESCRIPTION

Figure 1:
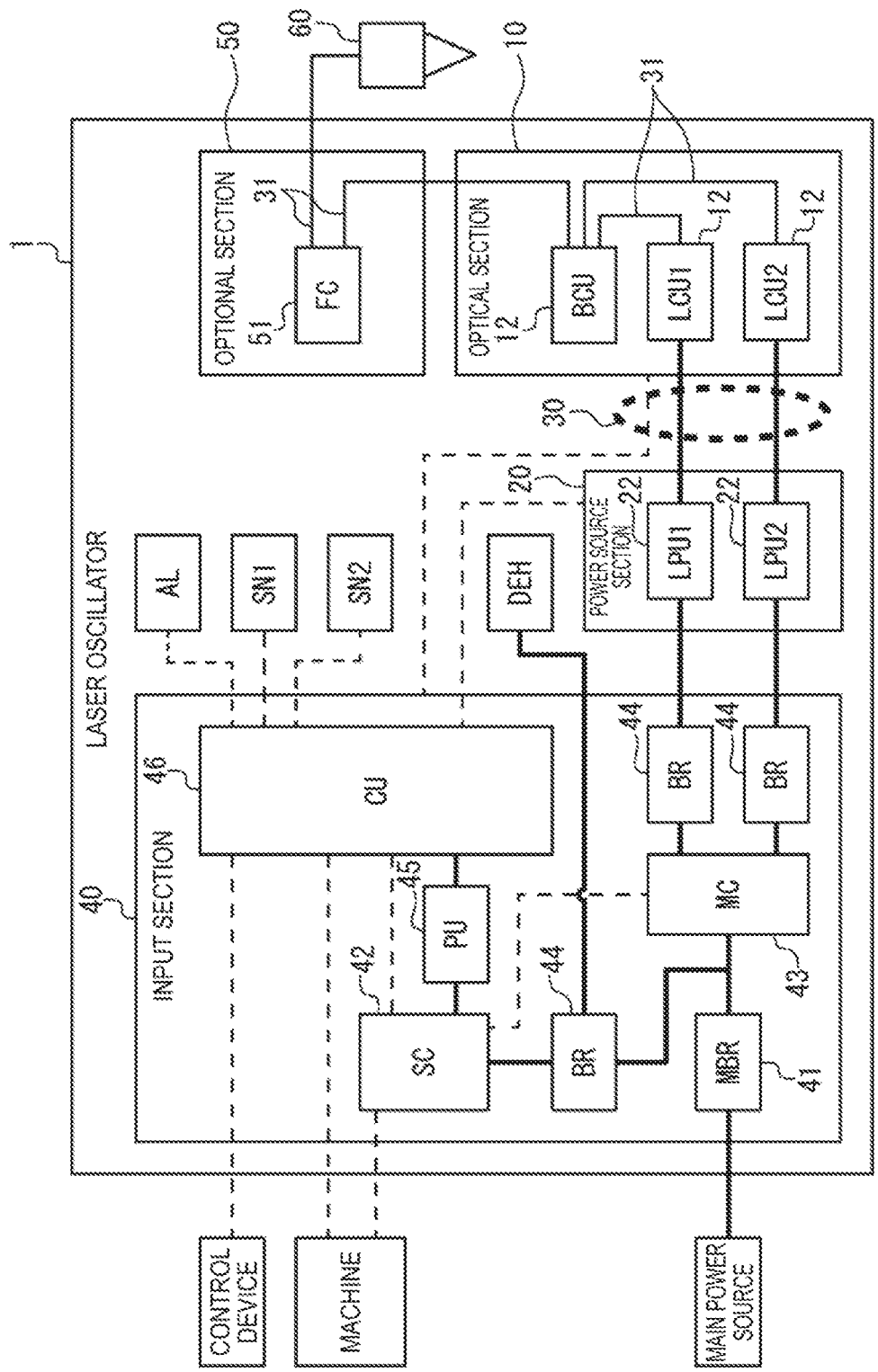
FIG. 1 is a block diagram illustrating a schematic configuration of a laser oscillator according to an embodiment.

Embodiments of the present disclosure will be described in detail below with reference to the accompanying drawings. In the drawings, identical or similar constituent elements are given identical or similar reference signs. Additionally, the embodiments to be described below are not intended to limit the technical scope of the invention or the meaning of terms set forth in the claims.

FIG. 1 illustrates a schematic configuration of a laser oscillator 1 according to the present embodiment. Note that in FIG. 1, a dashed line indicates a signal line, a bold line indicates a power line, and a solid line indicates an optical line. The laser oscillator 1 is, for example, a fiber laser oscillator, but may be a solid-state laser oscillator, a gas laser oscillator, a semiconductor laser, or the like, other than the fiber laser oscillator. The laser oscillator 1 includes an optical section 10 that generates a laser beam, a power source section 20 that supplies electricity to the optical section 10, and an electric cable 30 that electrically connects between the optical section 10 and the power source section 20. The electric cable 30 is removably connected to at least one of the optical section 10 and the power source section 20 by using a connecting member such as a connector. The optical section 10 includes one or a plurality of optical units 12, and the power source section 20 may include one or a plurality of power units 22. Depending on the number of these units, a plurality of electric cables 30 may be provided, and the electric cable 30 is removably connected to at least one of the optical unit 12 and the power unit 22.

The optical unit 12 includes one or a plurality of laser cavity units (LCU1, LCU2, and the like), a beam combiner unit (BCU1, and the like), and the like. Although not illustrated, the laser cavity unit includes an excitation light source, a laser medium, and the like. The excitation light source is, for example, a laser diode, but may be another light source such as a lamp. The excitation light source is supplied with electricity from the power unit 22 through the electric cable 30. The laser medium is, for example, a fiber for amplification, but may be another solid-state laser medium or gas laser medium. The beam combiner unit is provided with a beam combiner, a light source for guide, sensors, and the like which are not illustrated. The beam combiner couples the laser light oscillated from the one or the plurality of laser cavity units to generate a laser beam with high power. The guide light source is, for example, a laser diode, and is supplied with electricity from the power unit 22 through the electric cable 30. The sensors include, for example, a measurement sensor that measures a laser output and a return light quantity, an alarm, and the like, and are supplied with electricity from the power unit 22 through the electric cable 30. The optical units 12 such as the laser cavity units, the laser combiner unit may be coupled by fusing optical fibers 31 to each other.

The power unit 22 includes one or a plurality of laser power units (LPU1, LPU2, and the like), other power units (not illustrated), and the like. Although not illustrated, the laser power unit includes a control circuit that controls a current supplied to an excitation light source of the optical unit 12, and supplies electricity to the excitation light source through the electric cable 30. The other power units supply electricity to the guide light source, the sensors, and the like of the optical unit 12 through the electric cables 30.

The laser oscillator 1 may further include an input section 40 that inputs at least one of a power and a signal. The input section 40 is connected to a main power source, a control device, a machine, and the like outside the oscillator, and is connected to an alarm light (AL), sensors (SN1, SN2, and the like), a dehumidifier (DEH), and the like inside the oscillator. The input section 40 includes a main breaker (MBR) 41 and a branch breaker (BR) 44 for preventing overcurrent and the like, a safety circuit (SC) 42 and a magnetic contactor (MC) 43 for safely turning on and off a circuit, a control power unit (PU) 45 and a control unit (CU) 46 for controlling the laser oscillator 1.

The laser oscillator 1 preferably further includes an optional section 50 that selectively includes an accessory unit. The accessory unit includes a fiber coupler (FC) 51 for changing a fiber diameter, a beam branch unit (not illustrated) that branches the generated laser beam into a plurality of optical fibers, and the like. The optical section 10 and the optional section 50 may be coupled by fusing the optical fibers 31 to each other. The optional section 50 is connected to a machining head 60 outside the oscillator through the optical fiber 31.

Figure 2A:
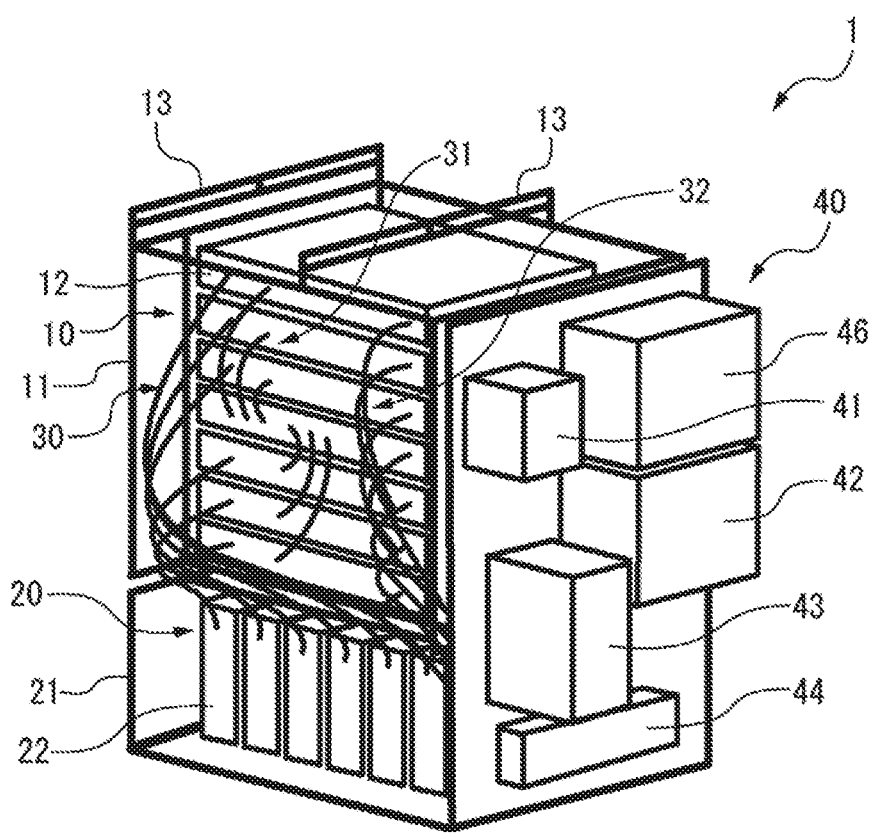
FIG. 2A is a perspective view illustrating a schematic structure of the laser oscillator according to the embodiment.

FIG. 2A illustrates a schematic structure of the laser oscillator 1 according to the present embodiment. The laser oscillator 1 includes a first structure 11 disposed with the optical section 10, and a second structure 21 disposed with the power source section 20. The first structure 11 and the second structure 21 are configured as a frame structure (framework), a plate structure, or a combination thereof by using a rigid member such as metal. The first structure 11 is removably connected to the second structure 21 by a fastening member such as a screw or an engaging member such as a concave and convex portion.

As illustrated in FIG. 2A, the optical section 10 may include a plurality of optical units 12, and the power source section 20 may include a plurality of power units 22. Depending on the number of these units, a plurality of electric cables 30 are provided, and the electric cable 30 is removably connected to at least one of the optical unit 12 and the power unit 22. The electric cable 30 is preferably fixed along the second structure 21 provided with the power source section 20. As a result, it is difficult for noise to enter the electric cable 30, and the beam quality is improved.

The laser oscillator 1 may include a refrigerant tube 32 that is removably connected to the optical section 10 by a connecting member such as a coupler. A refrigerant that cools the optical section 10, for example, cooling water, or the like is flowed through the refrigerant tube 32. Depending on the number of units of the optical units 12, a plurality of refrigerant tubes 32 are provided, and the refrigerant tube 32 is removably connected to the optical unit 12. In order to ensure an arrangement space of the electric cables 30 or the refrigerant tubes 32, a frame or a plate may be provided inside the first structure 11 and the second structure 21, and the electric cables 30 or the refrigerant tubes 32 are preferably fixed along the frame or the plate.

Figure 2B:
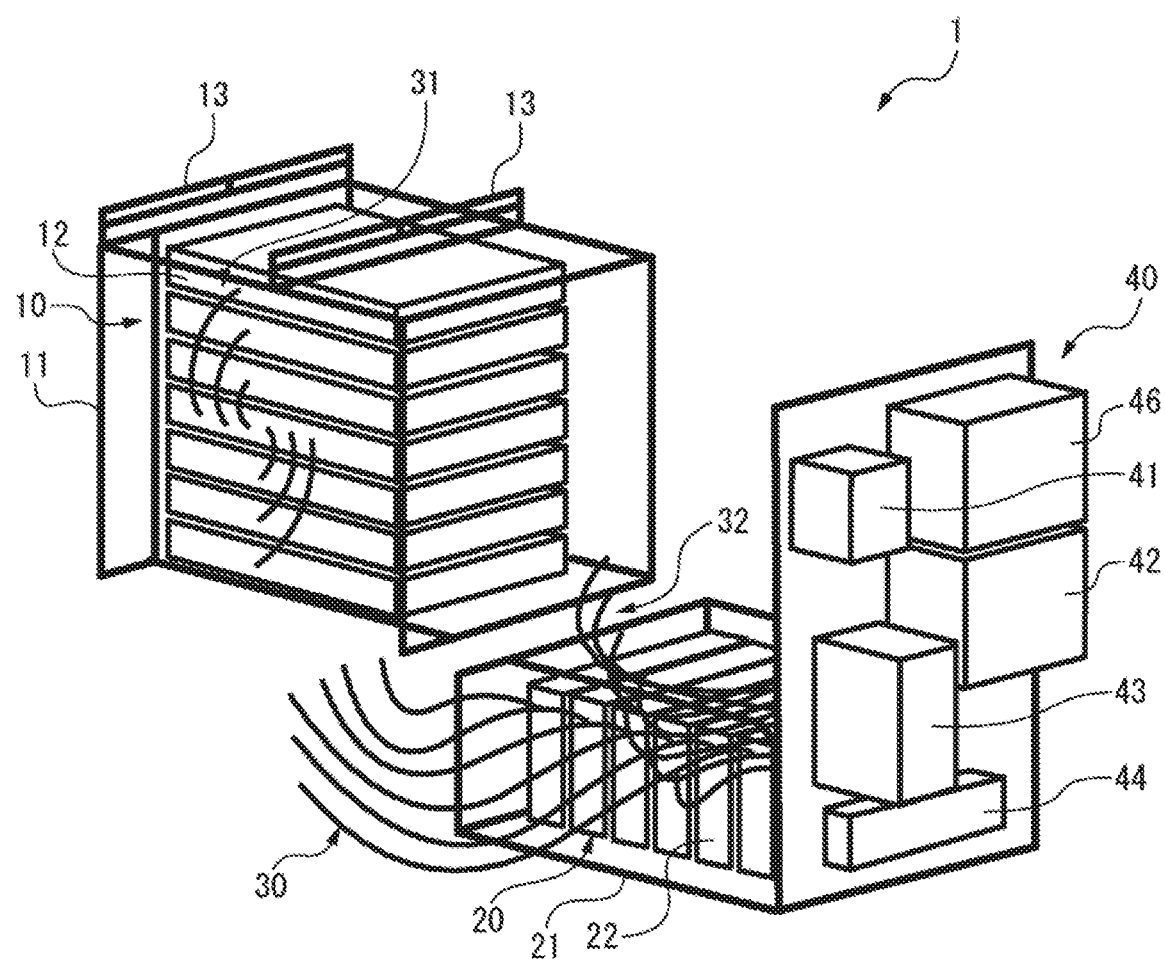
FIG. 2B is a perspective view illustrating an example of an optical section separated from a power source section.

FIG. 2B illustrates an example of the optical section 10 separated from the power source section 20. In the laser oscillator 1 of the present example, the electric cables 30 (and, as necessary, the refrigerant tubes 32, the same applies to the following) are removed from the optical units 12, and the optical section 10 can be entirely replaced by only separating the first structure 11 disposed with the optical section 10 from the second structure 21 disposed with the power source section 20. As a result, the fusing operation of the optical fibers 31 in the field becomes unnecessary, and it is possible to perform the fusing operation without a risk in a highly clean room installed at another location. It is also possible to replace only the damaged optical unit 12 by cutting the optical fiber 31. On the other hand, the first structure 11 disposed with the new optical section 10 is coupled to the second structure 21 disposed with the power source section 20, and the electric cables 30 are simply connected, thereby completing the maintenance work in the field. Accordingly, the laser oscillator 1 can be recovered in a short time, and downtime of the laser oscillator 1 can be shortened.

Note that since the first structure 11 disposed with the optical section 10 has a substantial weight, the laser oscillator 1 is preferably further provided with a carrier 13 for conveying the first structure 11. The carrier 13 may be, for example, a jig for a forklift, an eye bolt for a crane, or the like.

Also, the electric cable 30 may be removably connected to only the power unit 22 instead of being removably connected to the optical unit 12. In this case, the electric cable 30 may be fixed along the first structure 11 disposed with the optical section 10, and it preferably becomes difficult for noise to enter the electric cable 30. In replacing the optical section 10, the optical section 10 is entirely replaced with the electric cables 30 connected to the optical section 10. Furthermore, when the power source section 20 is damaged, the electric cable 30 can be removed from the power unit 22 and only the damaged power unit 22 can be replaced.

Figure 3:
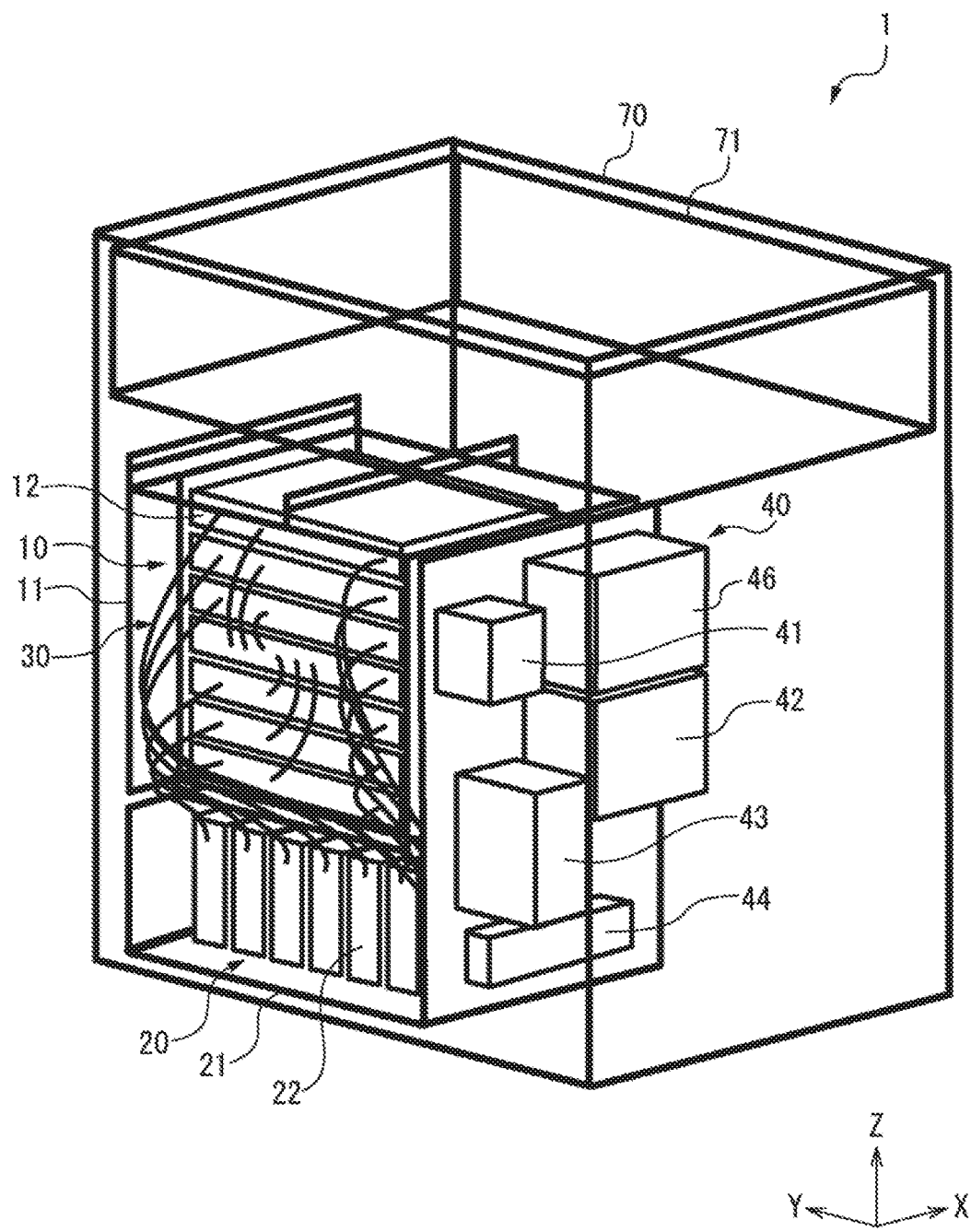
FIG. 3 is a perspective view illustrating an example of a housing with a door.

FIG. 3 illustrates an example of a housing 70 with a door. The laser oscillator 1 preferably further includes the housing 70 with the door. The housing 70 houses the first structure 11 disposed with the optical section 10 and the second structure 21 disposed with the power source section 20 (and the input section 40 as necessary). The housing 70 may include a door (not illustrated) openable/closable in any one direction of an X-direction, a Y-direction, and a Z-direction, and the interior of the oscillator is preferably sealed when the door 70 is closed. Such a door 70 facilitates not only replacement of the optical section 10 but also replacement of the power source section 20 or the input section 40. When the power source section 20 or the input section 40 is to be replaced, replacement for each unit such as the power unit 22, and the control unit 46 can be performed.

The laser oscillator 1 preferably further includes a third structure 71 disposed with an optional section (not illustrated). The third structure 71 is stored inside the housing 70. The third structure 71 can easily correspond to a variety of accessory units.

Figure 4:
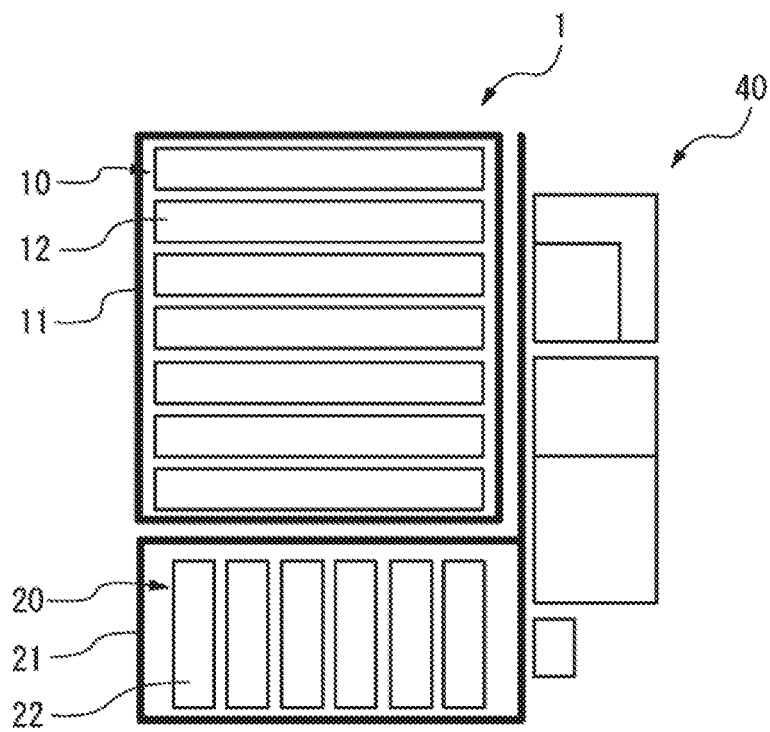
FIG. 4 is a front view illustrating an example of arrangement of respective constituent elements.

FIG. 4 illustrates an example of the arrangement of the respective constituent elements. In the laser oscillator 1 described above, the first structure 11 disposed with the optical section 10 has a rectangular parallelepiped shape, and the second structure 21 disposed with the power source section 20 has an L-shape. Also, the first structure 11 is preferably disposed on an upper side of the second structure 21. This facilitates the replacement of the optical section 10. Furthermore, by disposing the input section 40 on a side of the second structure 21 and disposing the power source section 20 on a lower side of the second structure 21, the space-saving laser oscillator 1 can be provided in terms of a size of each constituent element and routing of wiring.

Figure 5:
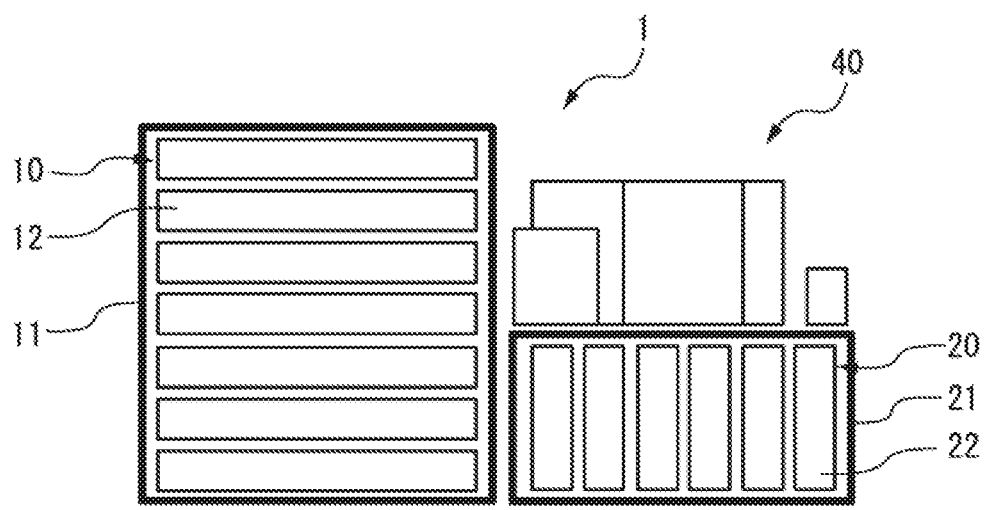
FIG. 5 is a front view illustrating a modified example of the arrangement of the constituent elements.

FIG. 5 illustrates a modified example of the arrangement of the respective constituent elements. In the laser oscillator 1 of the present example, both the first structure 11 disposed with the optical section 10 and the second structure 21 disposed with the power source section 20 have a rectangular parallelepiped shape. Also, the first structure 11 is disposed on a side of the second structure 21. This facilitates the replacement of the optical section 10. Furthermore, by disposing the input section 40 above the second structure 21 and disposing the power source section 20 on a lower side of the second structure 21, it is possible to provide the space-saving laser oscillator 1 in a vertical direction.

Figure 6:
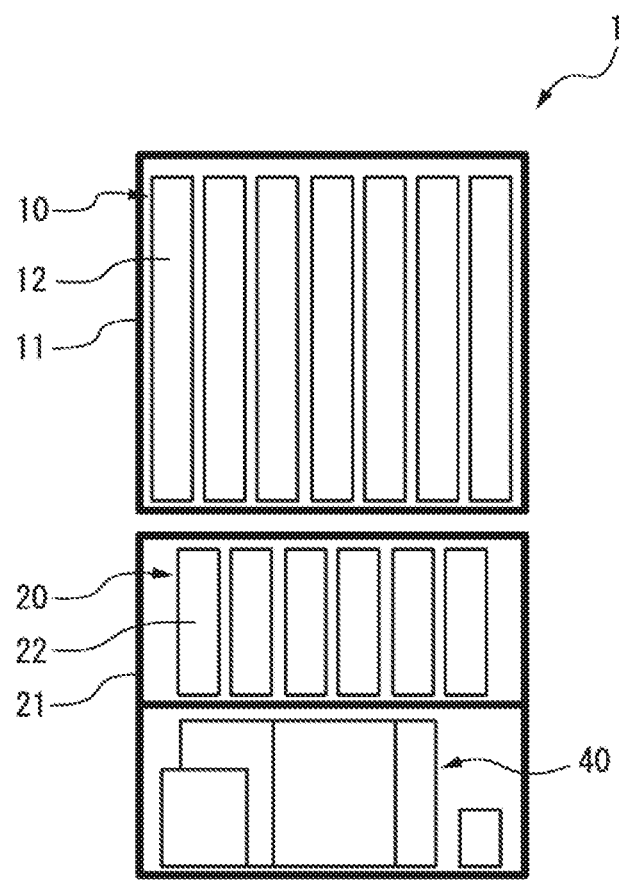
FIG. 6 is a front view illustrating another modified example of the arrangement of the respective constituent elements.

FIG. 6 illustrates another modified example of the arrangement of the respective constituent elements. In the laser oscillator 1 of the present example, both the first structure 11 disposed with the optical section 10 and the second structure 21 disposed with the power source section 20 have a rectangular parallelepiped shape. Also, the first structure 11 is disposed above the second structure 21. This facilitates the replacement of the optical section 10. The optical section 12 may be placed vertically rather than laterally as illustrated in FIG. 4 and FIG. 5. Further, the input section 40 is disposed on a lower side of the second structure 21, and the power source section 20 is disposed on an upper side of the second structure 21, thereby providing the space-saving laser oscillator 1 in a lateral direction.

According to the embodiment described above, the laser oscillator 1 can be provided in which the optical section 10 can be entirely replaced by simply removing the electric cables 30 and separating the first structure 11 disposed with the optical section 10 from the second structure 21 disposed with the power source section 20. In addition, the first structure 11 disposed with the new optical section 10 is coupled to the second structure 21 disposed with the power source section 20, and the electric cables 30 are simply connected, thereby completing the maintenance work in the field. Accordingly, the laser oscillator 1 can be recovered in a short time, and downtime of the laser oscillator 1 can be shortened. Thus, the laser oscillator 1 with enhanced maintainability can be provided.

Although various embodiments have been described in this specification, the present invention is not limited to the above-described embodiments, and it is to be understood that various changes can be made without departing from the scope of the appended claims.

The invention claimed is:

1. A laser oscillator comprising:
a first structure disposed with an optical section therein that generates a laser beam;
a second structure having a different shape from the first structure and disposed with a power source section therein configured to directly supply electricity to the optical section;
plurality of electric cables that connect to the optical section and the power source section, wherein
the optical section includes a plurality of optical units, and the power source section includes a plurality of power units; and
an input section disposed on a whole side of the second structure, wherein
the first structure is disposed on an upper side of the second structure, and directly and removably coupled to the second structure, the plurality of electric cables are removably connected to at least one of the optical section and the power source section, and at least one of the plurality of optical units of the optical section is configured to be replaced from the first structure when a corresponding one of the plurality of electric cables is moved therefrom.

2. The laser oscillator of claim 1, wherein
the first structure has a rectangular parallelepiped shape, and the second structure has an L-shape.

3. The laser oscillator of claim 1, wherein
the first structure and the second structure have a rectangular parallelepiped shape, and the first structure is disposed on a side and above the second structure.

4. The laser oscillator of claim 3, wherein
the input section is further disposed on an upper side or a lower side of the second structure, and the power source section is disposed on a lower side or an upper side of the second structure.

5. The laser oscillator of claim 1, further comprising:
a housing with a door, wherein
the first structure and the second structure are stored inside the housing.

6. The laser oscillator of claim 5, further comprising:
a third structure disposed with an optional section, wherein
the third structure is stored inside the housing.

7. The laser oscillator of claim 1, wherein
the electric cable is fixed along the first structure or the second structure.

8. The laser oscillator of claim 1, further comprising:
a refrigerant tube removably connected to the optical section.

9. The laser oscillator of claim 1, further comprising:
a carrier that is used for conveying the first structure.

* * * * *